United States Patent
Jung et al.

(10) Patent No.: US 6,855,379 B2
(45) Date of Patent: *Feb. 15, 2005

(54) METHOD AND DEVICE FOR SURFACE-TREATING SUBSTRATES

(75) Inventors: Thomas Jung, Hötzum (DE); Claus-Peter Klages, Braunschweig (DE)

(73) Assignee: Fraunhofer-Gesellschaft Zur Förderung der Angewandten Forschung E.V. (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/529,192

(22) PCT Filed: Sep. 18, 1998

(86) PCT No.: PCT/EP98/05982

§ 371 (c)(1),
(2), (4) Date: Jun. 26, 2000

(87) PCT Pub. No.: WO99/18593

PCT Pub. Date: Apr. 15, 1999

(65) Prior Publication Data

US 2003/0134051 A1 Jul. 17, 2003

(30) Foreign Application Priority Data

Oct. 6, 1997 (DE) .................................. 197 44 060

(51) Int. Cl.⁷ ..................... C23C 16/458; C23C 16/503; C23C 16/511; C23C 16/54

(52) U.S. Cl. ..................... 427/569; 427/575; 427/237; 427/255.5; 427/405; 118/718; 118/723 R; 118/723 E; 118/723 MW

(58) Field of Search ................................ 427/569, 575, 427/488, 209, 237, 248.1, 255.5, 405, 444, 532, 533, 535, 402, 508, 509; 118/718, 719, 723 R, 723 E, 723 MW, 715, 73 D, 720; 216/69, 71, 67

(56) References Cited

U.S. PATENT DOCUMENTS 3,068,510 A * 12/1962 Coleman ..................... 204/168
3,627,663 A * 12/1971 Davidse et al. ........ 204/192.15

(List continued on next page.)

FOREIGN PATENT DOCUMENTS

| DE | 42 35 953 A1 | * 4/1994 | |
| DE | 196 08 158 C1 | 8/1997 | |
| EP | 0 172 916 A1 | 3/1986 | |
| EP | 0 424 620 A2 | 5/1991 | |
| JP | 63026373 | 2/1988 | |
| JP | 03183782 | 8/1991 | ............ C23C/16/54 |
| JP | 05144748 A | * 6/1993 | |
| JP | 6044836 | 2/1994 | ............ H01B/13/00 |

Primary Examiner—Shrive P. Beck
Assistant Examiner—Wesley D. Markham
(74) Attorney, Agent, or Firm—Young & Basile, P.C.

(57) ABSTRACT

A method for surface treatment of at least one electrically conducting substrate or a substrate that has been coated so as to be conducting (1) by means of a gas placed in the region of an electric discharge (2). The discharge region is restricted by at least two essentially opposite sides of the substrate surface to be treated (7). This process is especially suitable for treating band-shaped and continuously supplied substrates.

31 Claims, 2 Drawing Sheets

U.S. PATENT DOCUMENTS

| | | | | |
|---|---|---|---|---|
| 3,999,094 A | * | 12/1976 | Chodil | 313/588 |
| 4,301,765 A | * | 11/1981 | Behn et al. | 118/50.1 |
| 4,452,828 A | | 6/1984 | Namba et al. | 427/39 |
| 4,508,053 A | * | 4/1985 | Eriksson | 118/712 |
| 4,637,853 A | | 1/1987 | Bumble et al. | |
| 4,737,379 A | * | 4/1988 | Hudgens et al. | 427/39 |
| 4,794,612 A | * | 12/1988 | Fuke | 372/56 |
| 4,824,544 A | * | 4/1989 | Mikalesen et al. | 204/298.06 |
| 4,894,546 A | * | 1/1990 | Fukui et al. | 250/423 R |
| 5,286,534 A | * | 2/1994 | Kohler et al. | 427/577 |
| 5,411,591 A | * | 5/1995 | Izu et al. | 118/718 |
| 5,482,611 A | * | 1/1996 | Helmer et al. | 204/298.17 |
| 5,527,391 A | * | 6/1996 | Echizen et al. | 118/719 |
| 5,582,648 A | | 12/1996 | Kaisha | 118/723 MW |
| 5,595,792 A | * | 1/1997 | Kashiwaya et al. | 427/570 |
| 5,716,480 A | * | 2/1998 | Matsuyama et al. | 136/249 |
| 5,803,976 A | * | 9/1998 | Baxter et al. | 118/718 |
| 5,900,342 A | * | 5/1999 | Visser et al. | 430/128 |
| 5,933,202 A | * | 8/1999 | Watanabe et al. | 345/94 |
| 5,935,335 A | * | 8/1999 | Kashiwaya et al. | 118/723 MR |
| 6,027,663 A | * | 2/2000 | Martin et al. | 216/71 |
| 6,099,667 A | * | 8/2000 | Vanden Brande et al. | 148/565 |

* cited by examiner

METHOD AND DEVICE FOR SURFACE-TREATING SUBSTRATES

BACKGROUND OF THE INVENTION

The invention concerns a method and device for surface treatment of substrates with the aid of a gas discharge.

In surface treatment of flat substrates by means of a gas discharge, such as low-pressure glow discharges, methods are known in which the discharge is maintained by means of a microwave antenna, a high-frequency electrode, or a pulsed or timewise continuous voltage, applied to the substrate. Substrate surfaces and counter-electrodes and microwave antennas are thereby mostly arranged opposite each other.

A critical disadvantage of this method is that as a rule, only a low plasma density can be generated and the rate of plasma cleaning or plasma coating of the substrate surface is therefore low. Although the plasma density can be also be increased by increasing the pressure, the associated decrease in the mean free path leads to the transport of materials to and from the substrate surface being strongly hindered. In addition, the tendency of the discharge to local contraction and instability grows. Also disadvantageous in this method is the fact that an undesirable coating of microwave-coupling windows or high-frequency electrodes arises, whereby the coupled power clearly decreases over time.

Also disadvantageous is the fact that large amounts of starting materials are thereby lost and that other internal surfaces of the vacuum chamber become coated in addition to the substrate.

Surface treatment of running metal bands, such as sheet steel or aluminum, activated or supported by an electric gas discharge, presents special problems in batch processes involving the treatment of substrates.

On the one hand, the high running speed of the band requires very high stationary coating rates and plasma densities, for sheet steel up to a rate of 100 m/min. For example, in order to deposit a coating thickness of 100 nm at a band speed of 100 m/min and a coating-zone length of 1 m, a stationary coating rate of 10 $\mu$m/min is required. This is about 2 orders of magnitude more than can be achieved with ordinary DC or AC glow discharges.

Plasma densities as high as possible are also to be strived for in order to achieve higher deposition rates for effective removal rates for surface contaminants (oils, fats, waxes) with formation of gaseous products on a rapidly running band. Ordinary glow discharges generally do not have a sufficient degree of ionization and have too low a proportion of active species such as oxygen atoms or hydroxyl radicals.

In addition to providing high plasma densities, production systems of this kind are expected to be able to be operated for several days without maintenance. A condition for this is that parasitic deposition of layers, i.e. the growth of layers in other places than on the sheet metal to be treated, be kept low. It should be considered that in 100 h the hypothetical "stationary" layer thickness on sheet metal at rest is up to 6 cm at a growth rate of 10 $\mu$m/min. Even if the parasitic growth rate on a counter-electrode, a deflector, or housing wall is only 1% of this value, the resulting layers with layer thickness of 600 $\mu$m would be unacceptable, since because of their internal tensions they would no longer adhere to their substrates and would disturb the coating process in the form of dislodged chips.

SUMMARY OF THE INVENTION

Starting from these and other disadvantages of the state of the art, the invention is based on the task of providing a method and a device for surface-treatment of substrates, which, in addition to high plasma densities, also provides a concentration of the high plasma densities in the immediate neighborhood of the surface to be treated, with simultaneous reduction of parasitic deposits. In addition, the coating of both moving substrates, e.g. bands, and stationary substrates is possible.

In order to restrict gas discharges spatially to the surfaces to be treated, one or more electrically conducting substrates or substrates that have been coated on at least two sides to make them conducting are used so that a concentrated plasma with high plasma density is formed in the immediate neighborhood of the substrate surfaces. Through local restriction of the discharge, parasitic effects on surfaces not to be treated are strongly reduced. The discharge preferably involves a glow discharge.

The restriction of the discharge region occurs preferably on at least two essentially opposite sides, and can be, for example, in the form of a cylinder or prism with a round or polygonal cross section, depending on the shape of the substrate to be coated. It is also especially appropriate to enclose the discharge region between two flat substrates arranged Parallel to one another. Regardless of the shape of the enclosure, the distance between the opposite surfaces in each case should be about one mm to 50 cm, preferably one cm to ten cm.

In addition to surface treatment of stationary substrates in a batch process, the process according to the invention is especially suitable for treating continuously moving substrates, for example, materials in the shape of a band. Here, the discharge region is restricted by having one or more substrate bands pass, at least in some regions, with a short distance from the gas discharge and thereby restrict the discharge region. Thus, for example, two bands can be fed parallel to each other in some regions and the stationary gas discharge is enclosed by one of the band surfaces to be treated each time.

Especially advantageous is the surface treatment of one or more band-shaped substrates, which are turned while changing their direction of movement at least once. The substrates restrict the discharge region, at least on the one hand, by means of a surface region that lies before the turn in the direction of the band movement, and one the other hand, by means of a surface region that lies after the turn in the direction of the band movement. In this way, the surfaces of the band-shaped substrate to be treated pass the discharge zone at least twice each time the band is fed. A surface treatment made much more intense in this way permits an advantageous increase in the rate of movement.

The electric discharge preferably involves a discharge in the region of the hollow-cathode discharge. By this, according to the invention, it is also understood to mean a discharge in the transition region between hollow-cathode discharge and normal discharge. The entire substrate, which can be at ground potential, thereby forms the cathode. An anode, which is as a positive potential with respect to ground, is located as a counter-electrode in an appropriately selected site in the apparatus, preferable at the edge of the gas discharge. Even with a microwave-activated discharge, a hollow-cathode discharge can be constructed. The plasma then forms a "virtual" anode.

A hollow-cathode discharge is significantly more intense than an ordinary glow discharge between a cathode and an anode arranged parallel to each other. Ionization an order of magnitude higher is achieved, and significantly higher corresponding coating and removal rates are achieved. The hollow-cathode discharge is formed by use of a DC or AC voltage when the substrate surfaces restrict the discharge region to the shape of a hollow space, i.e. on at least two sides, and suitable process parameters (pressure, distance of the substrate surface, voltage, etc.) are chosen depending on the substrate geometry or the geometry of the discharge region. A hollow-cathode discharge between, e.g., two parallel plates appears as a clearly higher discharge current in comparison to the sum of the currents at each separate discharge at each of the two plates.

An electric discharge can be also realized, in addition to a DC or AC voltage, by coupling microwaves in the discharge region. For this, the discharge region defined by the substrate surface has a geometry that favors the spread of the microwaves in certain spatial regions and the formation of a gas discharge by achieving a stronger electric field. Preferably, the discharge region also has a hollow spatial geometry; in which case, the dimensions of the hollow space are adapted to the wavelengths of the microwave radiation used. As a further refinement, one can envision feeding microwaves and an electric voltage, preferably a DC voltage, into the discharge region simultaneously.

Supply and removal of gas take place directly in the discharge region or at a negligible distance from it. By a suitable arrangement of the gas supply and removal, the discharge can be restricted to the immediate planned discharge region between the substrate surface, and parasitic discharges are strongly reduced. Preferably, the means of gas supply and removal are arranged on the side opposite the discharge region, so that a permanent flow can be maintained.

BRIEF DESCRIPTION OF THE DRAWINGS

Additional advantages and further refinements of the invention can be seen in the figures and the embodiment examples described below. Shown are.

BRIEF DESCRIPTION OF THE PREFERRED EMBODIMENTS

Figure 1:
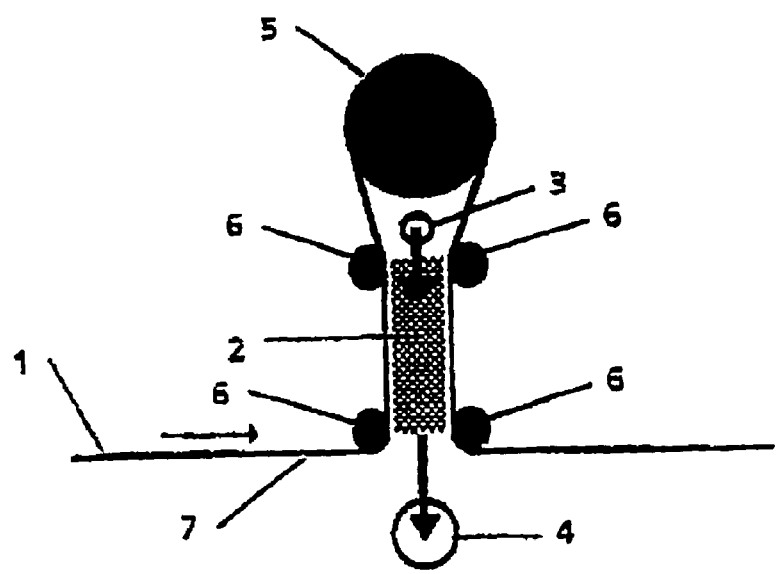
FIG. 1 shows implementation of a process according to the invention using a continuously running band-shaped substrate.
Figure 2:
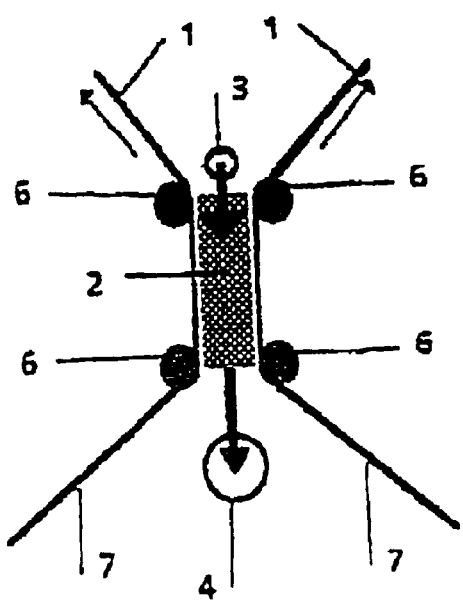
FIG. 2 shows implementation of a process according to the invention using two continuously running band-shaped substrates.
Figure 3:
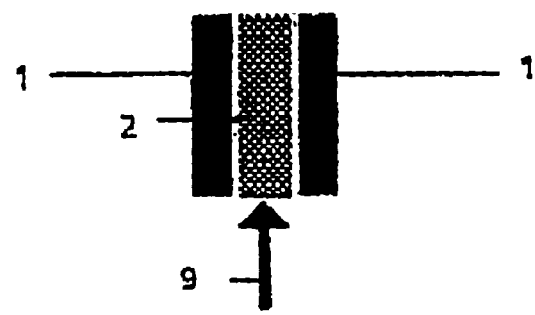
FIG. 3 shows implementation of process according to the invention using two stationary substrates.
Figure 4:
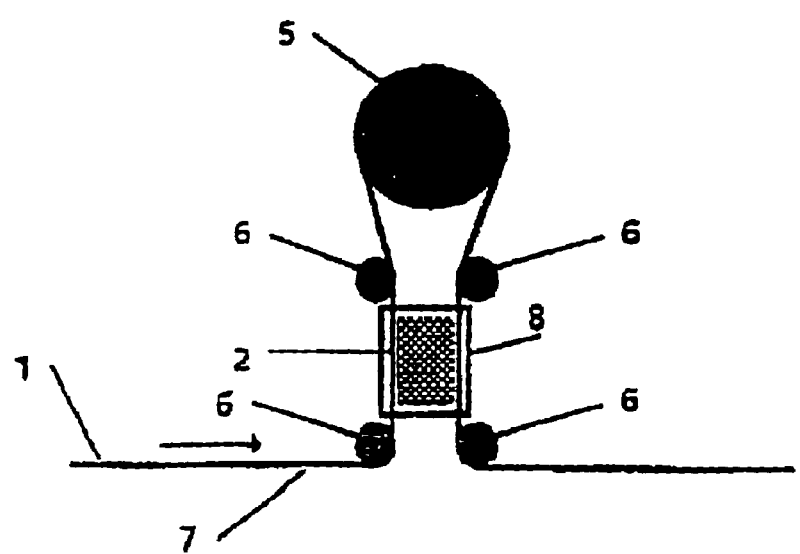
FIG. 4 shows implementation of the process according to the invention using a continuously running substrate that is surrounded by a deflecting element.

The substrate 1 shown in FIGS. 1, 2, and 4 involves aluminum sheet metal 0.15 mm thick and 50 cm wide, in the shape of a band and supplied continuously. Other substrates, for example, steel or materials that have been coated so as to be conducting, can also be treated likewise. The substrate 1 in FIG. 3 involves two stationary, parallel plates.

If the treated substrate 1 is heated too strongly, it can be cooled during surface treatment. The cooling can take place by means of a cool body through which a liquid or gaseous cooling medium flows and is in direct physical contact with the substrate. With stationary substrates, cooling can occur by means of cooling plates; and with moving substrates, by means of cooling rollers.

Substrate 1 can be grounded or connected to the ungrounded output of a voltage source. The voltage between substrate and a plasma formed by the electric discharge is preferably between one volt (V) and 3000 V, more preferably between 100 V and 1000 V. Pulsed DC voltages with a pulse frequency between ten kHz and 100 kHz can also be considered as DC voltages. When low-frequency AC voltages are used, the frequency is preferably between 50 Hz and 60 Hz, and with intermediate-frequency AC voltages preferably between ten kHz and 100 kHz. High-frequency AC voltages preferably have frequencies between one MHz and 50 MHz. Instead of, or in addition to, supplying power with a voltage source, it can also be supplied by microwaves. The microwave frequencies are preferably in the gigahertz (GHz) range.

All arrangements shown in FIGS. 1 through 4 are, together with possible spools for winding and unwinding the band(s), placed in vacuum chambers (not shown). When band-shaped substrates are used, the substrate can also be moved to and from the discharge region 2 by spools and vacuum locks outside the vacuum chamber. The discharge runs preferably at a pressure between 0.01 mbar and 100 mbar, especially preferably between 0.1 and 5 mbar.

Through gas lines 3 (not shown in FIGS. 3 and 4), inert gases such as argon, reactive gases, or even gas mixtures are introduced into the vacuum chamber. Reactive gases that can be considered include, for example, oxidizing, reducing, or carbon-containing or silicon-containing gases, such as oxygen, hydrogen, nitrogen, methane, acetylene, silane, hexamethyldisiloxane, tetramethylsilane, etc. With the aid of the reactive gases, for example, layers can be applied and materials can be removed, or gaseous components can be integrated into the surface regions. Thus, substrate surfaces can be cleaned of impurities such as lubricants, corrosion-protection agents, or oxide layers, or can be provided with corrosion-protection layers, adhesive layers for subsequent coatings, anti-friction layers to improve shaping properties, or decorative layers.

Gas removal lines 4 (not shown in FIGS. 3 and 4) from the vacuum chamber assure that products that might be deposited or applied from the discharge zone are removed without an opportunity to become deposited or applied parasitically.

Another possibility for reducing parasitic effects consists of arranging deflection elements, of sheet metal, for example, in the vacuum chamber. These deflection elements are electrically isolated from the components of the device and from the substrate in those regions of the vacuum chamber (chamber walls, flanges, etc.), where parasitic discharges could form because of the existing potentials, or else they enclose the discharge region and the substrate. In FIG. 4, a deflection element of this kind is shown in the form of a metal cage 8.

Finally, other deflection elements, electrically isolated from device components and substrates, permit the sides of the discharge region that do not adjoin the substrate surfaces region to be sealed. Cracks remaining between these deflection elements and the substrates can be closed with an insulating material (oxide ceramic, heat-resistant plastic). By this means, it can be assured that only a small number of charge carriers can escape from the hollow space of the discharge region.

The geometric dimensions of the device shown in FIGS. 1, 2, and 4 will be explained in the following. The diameter of the upper, thick, turning roller 5 (FIGS. 1 and 4) is 50 cm and the diameter of the four lower rollers 6, arranged in a rectangle, is 16 cm. The horizontal distance between the axes of the lower rollers 6 and the vertical distance between the axes of the lower rollers 6 is 19 cm and 30 cm, respectively. A volume of about 30×50×3 cm, which is especially favorable for forming a hollow-cathode glow discharge, arises between parts of the aluminum sheet metal.

Gas supply 3 occurs according to FIGS. 1 and 2 through a stainless-steel tube 1 cm in diameter provided with 50 holes, each 0.7 mm in diameter. This stainless-steel tube is arranged parallel to the axes of the small rollers 6. Gas removal 4 occurs through a stainless-steel tube, also provided with holes, below the lower pair of rollers. The stainless-steel tube for gas removal 4 has 100 2 mm-diameter holes. Gas is pumped out by means of a Roots pump, which has an effective suction capacity of 500 m³/h.

In FIGS. 1, 2, and 4, the sheet metal 1 supplied is electrically isolated from the housing and grounded. The gas-supply tube serves as the counter-electrode (anode). Either a DC voltage source (10 to 1000 V) or an intermediate-frequency voltage source (35 kHz, 500-V peak voltage) can be used as the voltage source. In FIG. 3, a hollow-cathode discharge is activated by feeding in microwaves 9.

EMBODIMENT EXAMPLE 1

Cleaning

The entering sheet metal 1 is moistened with a foam of paraffin oil (about 0.5 g/m²). The band speed is 10 m/min and the pressure is 0.5 mbar. Synthetic air (an oxygen/nitrogen mixture in a 1:4 ratio) is used as the gas with a volume flow of 4.5 m³/h. At a DC voltage of 450 V, an intense discharge is formed between the metal pieces. After passing through the discharge zone, the sheet metal has on the side 7 to be treated a surface energy of 55 dynes/cm (determined with test inks). This confirms that the oil has been completely removed.

EMBODIMENT EXAMPLE 2

Plasma Polymerization

In this example, the band speed is 20 m/min and the pressure is likewise 0.5 mbar. A mixture of argon and HMDSO (hexamethyldisiloxane) is used as the gas in a 10:1 partial-pressure ratio, and a total volume flow of 70 mbar [sic, mL]×1/s (4.2 sLm) is used. By applying an intermediate-frequency voltage (500 V), a hollow-cathode discharge is formed between the metal parts. A plasma-polymer layer with a thickness of 53 nm is deposited on the surface of the sheet metal 7. The dynamic rate (product of band speed and layer thickness) of this system is about 1060 m×nm/min. On sheet metal at rest, the deposition rate is thereby about 30 nm/s.

EMBODIMENT EXAMPLE 3

Silicatization

Instead of the argon in Example 2, synthetic air is used with a volume flow of 60 mbar×1/s. The band speed is 30 m/min. A silicon oxide layer with a thickness of 30 nm is formed. The dynamic rate is 600 m×nm/min, the static rate is 17 nm/s. The composition of the layer (according to EPMA) is $SiO_{1.7}C_{0.2}$. The surface energy (test inks) is over 58 dyne/cm.

What is claimed is:

1. A process for coating of at least one electrically conducting substrate or a substrate that has been coated so as to be electrically conducting, the process comprising the steps of:
    placing a gas in a region of an electric discharge;
    restricting the discharge region on at least two opposite sides by surfaces to be coated, wherein the surfaces to be coated are supplied by one of two flat, parallel substrates and at least one continuously moving band-shaped substrate and wherein the surfaces to be coated form a hollow cathode used to enable a hollow-cathode glow discharge; and
    coating the surfaces to be coated by a hollow-cathode glow discharge, said discharge activated only by at least one of a DC voltage, a pulsed DC voltage, and an AC voltage having a frequency of up to 50 MHz.

2. The process according to claim 1 wherein the at least one substrate is the continuously moving band-shaped substrate, the process further comprising the step of:
    turning the at least one substrate at least once to change the direction of movement;
    wherein the discharge region is restricted on at least one side by an area of the substrate before the turn in the direction of movement, and on at least one other side by an area of the substrate after the turn in the direction of movement.

3. The process according to claim 1 wherein the restricting step further comprises the step of restricting the discharge region on two sides by substrate surfaces at a distance of one mm to 50 cm apart.

4. The process according to claim 1 wherein the electric discharge occurs at a pressure between 0.01 mbar and 100 mbar.

5. The process according to claim 1 wherein the at least one substrate is at ground potential.

6. The process according to claim 1 wherein a magnitude of a voltage between the at least one substrate and a plasma formed by said electric discharge is between one and 3000 volts.

7. The process according to claim 1 wherein the placing step further comprises the step of feeding the gas into one of the discharge region and an area immediately outside the discharge region.

8. The process according to claim 1 further comprising the step of removing the gas from one of the discharge region and an area immediately outside the discharge region.

9. The process according to claim 1 wherein the restricting step further comprises the step of restricting the discharge region on two sides by substrate surfaces at a distance of one to ten centimeters apart.

10. The process according to claim 1 wherein the hollow-cathode glow discharge is activated by one of a DC voltage, a pulsed DC voltage with a pulse frequency between ten kHz and 100 kHz, an AC voltage having a frequency between 50 Hz and 60 Hz, an AC voltage having a frequency between ten kHz and 100 kHz and an AC voltage having a frequency between one MHz and 50 MHz.

11. The process according to claim 1 wherein the at least one substrate comprises at least one band-shaped substrate and wherein the restricting step further comprises restricting the discharge region on two opposed, parallel sides by the at least one band-shaped substrate.

12. A device for coating of at least one electrically conducting substrate or a substrate that has been coated so as to be electrically conducting, the device comprising:
    a discharge region enclosed on at least two sides by substrate surfaces of at least one substrate to be coated;
    means for supplying electrical energy to the discharge region;
    a vacuum chamber to enclose the discharge region;
    means for supplying gas to the vacuum chamber;
    means for removing gas from the vacuum chamber; and
    an anode proximate to the at least one substrate and the anode operable to receive an activating voltage;
    wherein the substrate surfaces form a hollow cathode used to enable a hollow-cathode glow discharge, and wherein the at least one substrate is surface coated by the hollow-cathode glow discharge, said discharge activated by the activating voltage, the activating voltage being only at least one of a DC voltage, a pulsed DC voltage, and an AC voltage having a frequency of up to 50 MHz and wherein the substrate surfaces are supplied by one of two flat parallel substrates and at least one continuously moving band-shaped substrate.

13. The device according to claim 12 further comprising means for cooling the at least one substrate.

14. The device according to claim 12 further comprising a gas supply arranged in one of the discharge region and immediately outside the discharge region.

15. The device according to claim 12 further comprising means for gas removal arranged in one of the discharge region and immediately outside the discharge region.

16. The device according to claim 12 wherein the at least one substrate is a continuously running band adapted to be unwound from a first spool and adapted to be wound onto a second spool.

17. The device according to claim 16 wherein the first spool and the second spool are arranged outside the vacuum chamber, and the band is adapted to be introduced into and removed from the vacuum chamber by vacuum locks.

18. The device according to claim 16 wherein the first spool and the second spool are arranged inside the vacuum chamber.

19. The device according to claim 12 further comprising deflection elements arranged in the vacuum chamber, in the region of the sides of the discharge region not restricted by the substrate surfaces, wherein the deflection elements are electrically isolated from the at least one substrate.

20. The device according to claim 12 further comprising deflection elements arranged in the vacuum chamber, the deflection elements arranged at least one of in a region of a device component in which parasitic discharges could be formed due to potentials of the device component and around the at least one substrate and the discharge region, and wherein the deflection elements are electrically isolated from the device component and the at least one substrate.

21. The device according to claim 12 wherein a distance between the substrate surfaces is between one and ten centimeters.

22. The device according to claim 12 wherein the activating voltage is one of a DC voltage, a pulsed DC voltage with a pulse frequency between ten kHz and 100 kHz, an AC voltage having a frequency between 50 Hz and 60 Hz, an AC voltage having a frequency between ten kHz and 100 kHz and an AC voltage having a frequency between one MHz and 50 MHz.

23. The device according to claim 12 wherein the at least one substrate is at least one band-shaped substrate and wherein the discharge region is enclosed by two opposed, parallel sides by the at least one band-shaped substrate.

24. The device according to claim 23 further comprising at least one roller located outside the discharge region and supporting the at least one band-shaped substrate.

25. A process for coating of a substrate, the substrate being one of an electrically conducting substrate and a substrate coated so as to be electrically conducting, the process comprising the steps of:

placing a gas in a region of an electric discharge;

restricting the discharge region on at least two sides by substrate surfaces to be coated, wherein the substrate surfaces form a below cathode; and coating the substrate surfaces by a hollow-cathode glow discharge, said discharge activated by at least one of a DC voltage, a pulsed DC voltage, an AC voltage and microwaves; and wherein elements of the surface treatment process are integrated outside of the discharge region, the elements including means for placing the gas in the region and means or removing the gas from the region.

26. The process according to claim 25 further comprising the step of:

providing the substrate surfaces using at least one band-shaped substrate; and wherein the restricting step further comprises restricting the discharge region on two opposed, parallel sides by the at least one band-shaped substrate.

27. The process according to claim 26 wherein the elements further comprise at least one roller located outside the discharge region and supporting the at least one band-shaped substrate.

28. A device for coating of a substrate, the substrate being one of an electrically conducting substrate and a substrate coated so as to be electrically conducting, the device comprising:

at least one substrate defining a discharge region enclosed on at least two sides by substrate surfaces to be coated;

means for supplying electrical energy to the discharge region;

a vacuum chamber to enclose the discharge region;

means for supplying gas to the vacuum chamber;

means for removing gas from the vacuum chamber; and an anode proximate to the at least one substrate;

wherein the substrate surfaces from a hollow cathode, and wherein the substrate surfaces are coated by a hollow-cathode glow discharge activated by at least one of a DC voltage, a pulsed DC voltage, an AC voltage and microwaves; and wherein elements of said device are integrated outside of the discharge region, the elements including the means for supplying gas, the means for removing gas the anode.

29. The device according to claim 28 wherein the activating voltage is one of a DC voltage, a pulsed DC voltage with a pulse frequency between ten kHz and 100 kHz, an AC voltage having a frequency between 50 Hz and 60 an AC voltage having a frequency between ten kHz and 100 kHz and an AC voltage having a frequency between one MHz and 50 MHz.

30. The device according to claim 28 wherein the at least one substrate is at least one band-shaped substrate and wherein the discharge region is enclosed by two opposed, parallel sides by the at least one band-shaped substrate.

31. The device according to claim 30 further comprising at least one roller located outside the discharge region and supporting the at least one band-shaped substrate.

* * * * *